(12) United States Patent
Fish et al.

(10) Patent No.: US 12,706,271 B2
(45) Date of Patent: Aug. 11, 2026

(54) AIR BEARING SHAFT WITH WIDE OPERATING TEMPERATURE RANGE

(71) Applicant: Applied Materials, Inc., Santa Clara, CA (US)

(72) Inventors: Roger B. Fish, Bedford, MA (US); Jeffrey E. Krampert, Topsfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 356 days.

(21) Appl. No.: 18/587,325

(22) Filed: Feb. 26, 2024

(65) Prior Publication Data

US 2025/0273425 A1 Aug. 28, 2025

(51) Int. Cl.

| | |
|---|---|
| ***H01J 37/16*** | (2006.01) |
| ***F16C 17/22*** | (2006.01) |
| ***H01J 37/18*** | (2006.01) |
| ***H01J 37/305*** | (2006.01) |

(52) U.S. Cl.

CPC .............. *H01J 37/16* (2013.01); *F16C 17/22* (2013.01); *H01J 37/18* (2013.01); *H01J 37/3056* (2013.01); *H01J 2237/002* (2013.01)

(58) Field of Classification Search

CPC ........ H01J 37/16; H01J 37/18; H01J 37/3056; H01J 2237/002; F16C 17/22

See application file for complete search history.

(56) References Cited

U.S. PATENT DOCUMENTS

| | | | | |
|---|---|---|---|---|
| 10,569,299 | B2 | 2/2020 | Allen, Jr. et al. | |
| 10,971,327 | B1 * | 4/2021 | Mitchell ................ | H01J 37/20 |
| 10,974,276 | B2 | 4/2021 | Allen, Jr. et al. | |
| 2008/0280453 | A1 | 11/2008 | Koelmel et al. | |

(Continued)

FOREIGN PATENT DOCUMENTS

| | | |
|---|---|---|
| CN | 106381467 A | 2/2017 |
| CN | 117467962 A | 1/2024 |

(Continued)

OTHER PUBLICATIONS

Office Action mailed Feb. 4, 2026 in co-pending U.S. Appl. No. 18/541,018.

(Continued)

*Primary Examiner* — Sean Luck

(74) *Attorney, Agent, or Firm* — Nields, Lemack & Frame, LLC

(57) ABSTRACT

A system that reduces the amount of contaminants that enters a process chamber or air bearing via a movable shaft is disclosed. The movable shaft includes an outer shell made from a material having a low coefficient of thermal expansion. This allows the outer shell to be heated to sufficiently high temperatures to avoid condensation of contaminants on the shaft, while minimizing any change in the diameter of the shaft, which passes through an air bearing. The shaft may also have a temperature modification device disposed adjacent to the interior surface of the outer shell. In some embodiment, the shaft may include an inner liner. An insulative layer may be provided between the inner liner and the outer shell, such that the temperature of the outer shell does not cause the inner liner to thermally expand.

20 Claims, 4 Drawing Sheets

(56) References Cited

U.S. PATENT DOCUMENTS

| | | | |
|---|---|---|---|
| 2009/0140166 | A1 | 6/2009 | Muka |
| 2014/0263268 | A1 | 9/2014 | Cong et al. |
| 2015/0024579 | A1 | 1/2015 | Graff et al. |
| 2016/0204005 | A1 | 7/2016 | Oki et al. |
| 2020/0139401 | A1 | 5/2020 | Allen, Jr. et al. |
| 2023/0011261 | A1 | 1/2023 | Li et al. |
| 2023/0095095 | A1 | 3/2023 | Natarajan et al. |
| 2025/0201510 | A1 | 6/2025 | Fish et al. |
| 2025/0201514 | A1 | 6/2025 | Fish et al. |

FOREIGN PATENT DOCUMENTS

| | | | |
|---|---|---|---|
| KR | 2016-0033168 | A | 3/2016 |
| TW | 202329198 | A | 7/2023 |

OTHER PUBLICATIONS

Office Action mailed Feb. 4, 2026 in co-pending U.S. Appl. No. 18/541,019.
International Search Report and Written Opinion mailed May 8, 2025 in corresponding PCT application No. PCT/US2025/011720.
Notice of Allowance mailed May 22, 2026 in co-pending U.S. Appl. No. 18/541,018.
Notice of Allowance mailed May 22, 2026 in co-pending U.S. Appl. No. 18/541,019.

* cited by examiner

AIR BEARING SHAFT WITH WIDE OPERATING TEMPERATURE RANGE

FIELD

Embodiments of the present disclosure relate to systems that utilize shafts in process chambers, and more particularly, shafts that extend into a process chamber via an air bearing.

BACKGROUND

In certain processing systems, a workpiece is disposed in a process chamber, which is maintained at near vacuum conditions. The workpiece may also be disposed on a movable shaft in the process chamber that allows the workpiece to be moved relative to the incoming ion beam.

In these systems, the movable shaft passes through a wall in the process chamber such that part of the shaft is disposed outside the process chamber, while a second part of the shaft is within the process chamber. An air bearing may be used to provide near frictionless motion between the shaft and the wall. The air bearing also serves to maintain the pressure difference between the process chamber and the outside environment. The shaft is able to be translated so that the portion of the shaft that is disposed within the process chamber can be increased or reduced.

Contaminants, such as water vapor, may collect on the portion of the shaft that is disposed outside the process chamber. As the shaft is translated relative to the wall of the process chamber, these contaminants may enter the process chamber through the air bearing. Once inside the process chamber, these contaminants can affect the yield of the workpieces, or may negatively affect the components within the process chamber. Additionally, in some embodiments, an etching process performed within the process chamber may result in material being deposited on the shaft as a film, which may subsequently affect the operation of the air bearing when the film enters the air bearing.

Various approaches, such as applying a hydrophobic coating, may be used to minimize these issues. However, this coating may have shortcomings. Therefore, it would be beneficial if there were a system that allowed a shaft to be moved relative to the wall of a process chamber, while reducing or minimizing the amount of contaminants that are introduced into the process chamber or into the air bearing as the shaft extends into and is retracted from the process chamber.

SUMMARY

A system that reduces the amount of contaminants that enters a process chamber or air bearing via a movable shaft is disclosed. The movable shaft includes an outer shell made from a material having a low coefficient of thermal expansion. This allows the outer shell to be heated to sufficiently high temperatures to avoid condensation of contaminants on the shaft, while minimizing any change in the diameter of the shaft, which passes through an air bearing. The shaft may also have a temperature modification device disposed adjacent to the interior surface of the outer shell. In some embodiments, the shaft may include an inner liner. An insulative layer may be provided between the inner liner and the outer shell, such that the temperature of the outer shell does not cause the inner liner to thermally expand.

According to one embodiment, a workpiece processing system is disclosed. The workpiece processing system comprises a process chamber, maintained at near vacuum conditions; a shaft extending through a wall of the process chamber, wherein the shaft can be extended into and retracted from the process chamber; wherein the shaft comprises an outer shell constructed of a low CTE material; a temperature modification device disposed adjacent to an inner surface of the outer shell; and an insulative layer disposed between the temperature modification device and an interior of the shaft. In some embodiments, the shaft comprises an inner liner disposed within the outer shell, wherein the insulative layer is disposed between the temperature modification device and the inner liner. In certain embodiments, the inner liner comprises stainless steel, plastic or a wire mesh. In some embodiments, the low CTE material comprises Invar or Super Invar 32-5. In some embodiments, the temperature modification device comprises a resistive heater. In certain embodiments, a power supply is used to supply power to the resistive heater and a controller is used to control the power supplied to the resistive heater. In certain embodiments, a temperature sensor is used, wherein information from the temperature sensor is used by the controller to control the power supplied by the power supply to the resistive heater. In certain embodiments, the temperature sensor is mounted on an inner surface or outer surface of the outer shell. In some embodiments, the temperature modification device comprises fluid tubes. In certain embodiments, the fluid tubes are used to heat the outer shell, and a heater in communication with the fluid tubes is used such that fluid passes through the heater into the fluid tubes and returns to the heater. In certain embodiments, the fluid tubes are used to cool the outer shell, and a chiller is in communication with the fluid tubes such that fluid passes through the chiller into the fluid tubes and returns to the chiller. In some embodiments, a temperature sensor is mounted on an inner surface or outer surface of the outer shell, wherein information from the temperature sensor is used to control a flow rate and/or temperature of a fluid passing through the fluid tubes.

According to another embodiment, a beam-line ion implantation system is disclosed. The beam-line ion implantation system comprises an ion source to generate an ion beam; a mass analyzer; a process chamber, maintained at near vacuum conditions; one or more beam-line components to direct the ion beam toward a process chamber; and a shaft extending through a wall of the process chamber, wherein the shaft can be extended into and retracted from the process chamber; wherein the shaft comprises: an outer shell constructed of a low CTE material; a temperature modification device disposed adjacent to an inner surface of the outer shell; and an insulative layer disposed between the temperature modification device and an interior of the shaft. In certain embodiments, an inner liner is disposed within the outer shell, wherein the insulative layer is disposed between the temperature modification device and the inner liner, and wherein the inner liner comprises stainless steel, plastic or a wire mesh. In some embodiments, the low CTE material comprises Invar or Super Invar 32-5. In some embodiments, the temperature modification device comprises a resistive heater. In certain embodiments, the system includes a power supply to supply power to the resistive heater, a controller to control the power supplied to the resistive heater and a temperature sensor, wherein information from the temperature sensor is used by the controller to control the power supplied by the power supply to the resistive heater. In certain embodiments, the temperature sensor is mounted on an inner surface or outer surface of the outer shell. In some embodiments, the temperature modification device comprises fluid tubes. In certain embodiments, the fluid tubes are used to heat the outer shell, and a heater in communication with the fluid tubes is used such that fluid passes through the heater into the fluid tubes and returns to the heater. In certain embodiments, the fluid tubes are used to cool the outer shell, and a chiller in communication with the fluid tubes is used such that fluid passes through the chiller into the fluid tubes and returns to the chiller.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain systems, a workpiece is moved relative to the ion source via a movable shaft. A portion of this movable shaft may extend outside the process chamber.

Additionally, the actuator that controls the movement of the shaft may also be disposed outside the process chamber. The process chamber is typically maintained at near vacuum conditions, which may be less than 50 millitorr. In certain embodiments, the process chamber may be maintained at less than 10 millitorr. The environment outside the process chamber is typically at atmospheric pressure. An air bearing may be used to maintain the pressure differential between the outside environment and the process chamber. However, contaminants, such as water vapor, may collect on the portion of the shaft that is outside the process chamber. These contaminants may then enter the process chamber when the shaft is extended into the process chamber. As described above, these contaminants may affect the yield of the workpiece or affect the components within the process chamber. Additionally, a film may be deposited on the portion of the shaft that is inside the process chamber and affect the air bearing as the shaft is being retracted.

Figure 1:
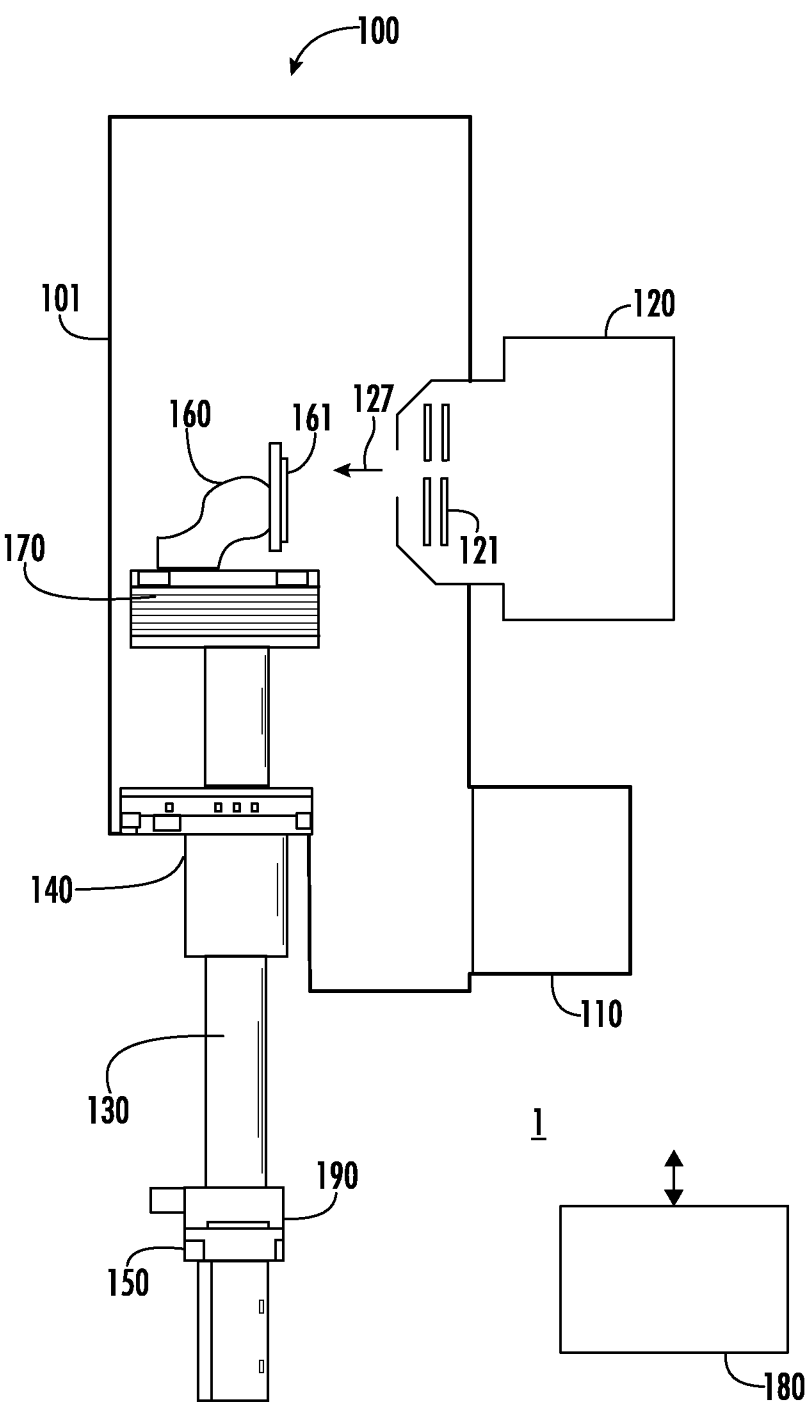
FIG. 1 is a view of the process chamber that utilizes the disclosed shaft according to one embodiment.

FIG. 1 shows a workpiece processing system that addresses these issues. The system may be used for ion implantation, deposition or etching processes. The system includes a process chamber 100, which comprises a plurality of walls 101 that define a sealed volume, which is maintained at near vacuum conditions. One or more vacuum pumps 110 may be in communication with the interior of the process chamber 100 to maintain the near vacuum pressure within the process chamber 100. As noted above, the pressure within the process chamber 100 may be less than 50 millitorr in certain embodiments. In other embodiments, the pressure within the process chamber 100 may be less than 10 millitorr. An ion source 120 may also be in communication with the process chamber 100. One or more extraction electrodes 121 may be disposed within the housing of the ion source 120 to extract the ion beam 127 from the ion source 120. In certain embodiments, a portion of the housing of the ion source 120 is disposed within the process chamber 100. However, in other embodiments, one or more components may be disposed between the ion source 120 and the process chamber 100.

Figure 2:
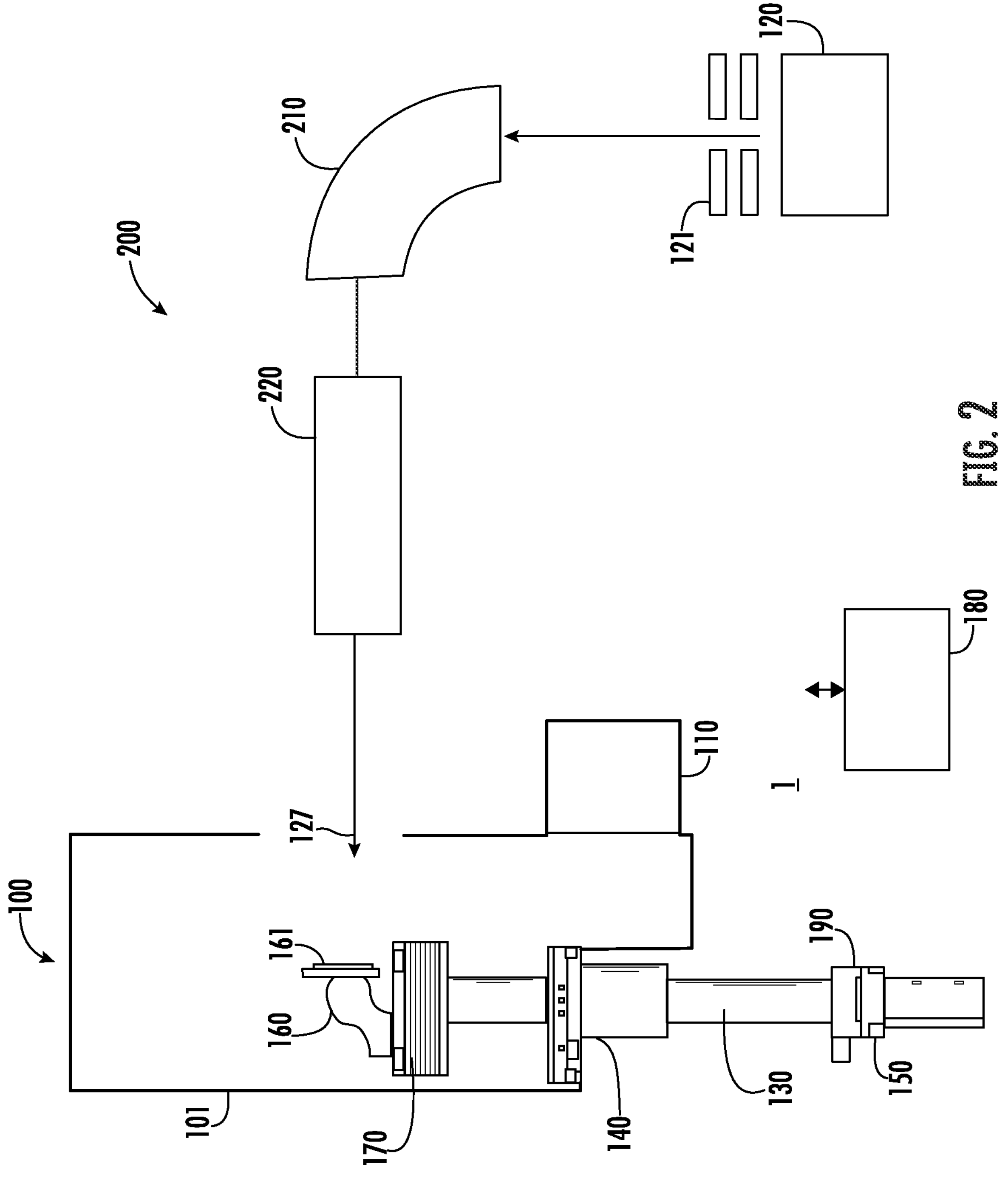
FIG. 2 shows a beam-line ion implantation system that includes a process chamber utilizing the shaft.

For example, as shown in FIG. 2, a beam-line ion implantation system 200 may have an ion source 120, one or more extraction electrodes 121, a mass analyzer 210, and one or more beam-line components 220, such as one or more acceleration/deceleration stages and a collimator, disposed between the ion source 120 and the process chamber 100. The one or more beam-line components 220 serve to direct the ion beam 127 from the ion source 120 toward the process chamber 100. Further, while FIG. 1 shows the ion source 120 in direct communication with the process chamber 100, and FIG. 2 shows one embodiment of a beam-line ion implantation system 200, other embodiments are possible and the disclosure is not limited to the embodiments shown in the figures. Thus, the process chamber 100 may be used for any process which may include additional or fewer components within and outside the process chamber 100.

As seen in FIG. 1 and FIG. 2, a shaft 130 extends into the process chamber 100. In certain embodiments, an air bearing 140 is used to form the barrier between the vacuum conditions within the process chamber 100 and the atmospheric environment 1 external to the process chamber 100. The air bearing 140 also creates a near frictionless interface between the shaft 130 and the wall 101 of the process chamber 100. The shaft 130 may be extended or retracted from the process chamber 100 by means of an actuator 150. A platen 160 is disposed at the end of the shaft 130 that is disposed in the process chamber 100. Connections to the platen 160, which include power and other electrical signals and optional heating and cooling channels, are provided through the interior of the shaft 130.

A controller 180 may be in communication with the actuator 150 to control the movement of the shaft 130. The controller 180 includes a processing unit and an associated memory device. This memory device contains the instructions, which, when executed by the processing unit, enable the controller 180 to perform the functions described herein. This memory device may be a non-volatile memory, such as a FLASH ROM, an electrically erasable ROM or other suitable devices. In other embodiments, the memory device may be a volatile memory, such as a RAM or DRAM. The processing unit may be a general purpose computer, a special purpose computer, a microcontroller or another type of electrical circuit.

During operation, an ion beam 127 may be extracted from the ion source 120 and directed toward the workpiece 161 that is disposed on the platen 160. The ion beam 127 may not be able to impact the entirety of the workpiece 161 at one time. Therefore, the workpiece 161 may be translated relative to the ion beam 127. This is performed by extending and retracting the shaft 130 from the process chamber 100 using the actuator 150.

As stated above, an air bearing 140 may be utilized to maintain the vacuum seal and to allow near frictionless movement of the shaft 130 relative to the wall 101 of the process chamber 100. Air bearings use a layer of pressurized gas between the shaft 130 and the wall 101 to provide a near frictionless interface. In some embodiments, the gap between the inner surface of the collar of the air bearing 140 and the outer surface of the shaft 130 may be less than 1 thousandths of an inch.

When the shaft 130 is extended to its maximum position in the process chamber 100, a first fraction of the shaft 130 is disposed within the process chamber 100. Conversely, when the shaft 130 is retracted to its minimum position in the process chamber, a second fraction, smaller than the first fraction, is disposed in the process chamber 100. The retraction of the shaft 130 may be limited by a first end stop 170. Similarly, the extension of the shaft 130 into the process chamber 100 may be limited by a second end stop 190. The end stops define the range of motion of the shaft 130.

It has been found that, conventional systems, in contaminants, such as water vapor, may collect on the portion of the surface of the shaft 130 that is disposed outside the process chamber 100. When the shaft 130 is then extended into the process chamber 100, these contaminants pass through the air bearing 140 and enter the process chamber 100. In some cases, the vacuum pump 110 may draw these contaminants away from the shaft 130. However, the contaminants may affect the workpiece 161 or the other components. In one specific example, the ion beam 127 may comprise halogenated ions, such as fluorine ions. Water vapor may be disposed on the shaft 130. The hydrogen in the water vapor may react with the halogenated ions to form volatile compounds, such as HF or HCl. These acids may cause deleterious effects within the process chamber 100. For example, the acids may damage the shaft 130. The acids may become airborne and damage other components within the process chamber 100, such as the platen 160 or the ion source 120.

Further, in some systems, the process chamber 100 may be utilized to perform an etching process. The material etched from the workpiece may become deposited on the shaft 130, forming a film. This film may then enter the air bearing 140 as the shaft 130 is being retracted from the process chamber 100, affecting the operation of the air bearing 140.

Figure 3:
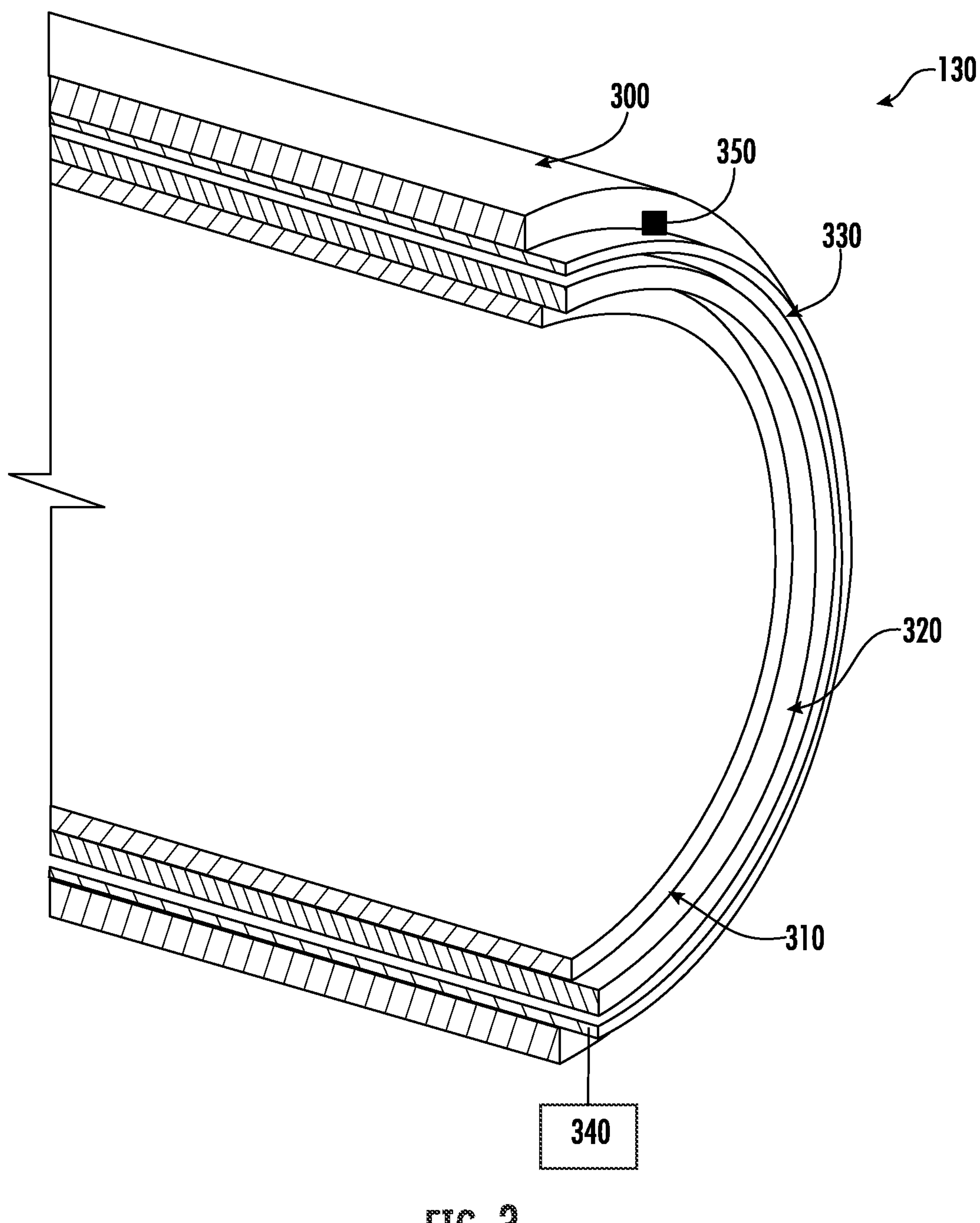
FIG. 3 shows a cross section of the shaft according to one embodiment.

To overcome these issues, a heated shaft is disclosed. However, due to the fact that the shaft 130 passes through an air bearing 140, it is desirable that the diameter of the shaft 130 does not change when heated. FIG. 3 shows a first embodiment of a shaft 130.

In this embodiment, the shaft 130 comprises an outer shell 300, formed as a hollow cylinder. The outer shell 300 may be constructed from a material known to have a low coefficient of thermal expansion (CTE). In this disclosure, the term "low CTE" refers to a CTE of less than 3 ppm/° C. over the temperature range from 20° C. to 100° C. In certain embodiments, the outer shell 300 may be constructed from Invar (also referred to as Invar 36, FeNi36 or 64FeNi), which is an iron-nickel alloy having a nickel concentration of about 36%. Invar has a CTE of roughly between 0.6 and 2.0 ppm/° C. over the range from 20° to 100° C. (such as about 1.2 ppm/° C.). Alternatively, the outer shell 300 may be made from Super Invar 32-5, which is an iron-nickel alloy having a nickel concentration of about 32% and a cobalt concentration of up to 5%. Super Invar 32-5 has a CTE of roughly 1 ppm/° C. over the range from 200 to 100° C. (such as about 0.63 ppm/° C.) Of course, other low CTE materials may be used. The outer shell 300 may have a thickness of between ⅛ and ⅜ inches.

The shaft 130 may also include an inner liner 310. The inner liner 310 may be constructed from stainless steel. In other embodiments, the inner liner 310 may be constructed from a plastic or a wire mesh. The inner liner 310 may be a hollow cylinder and have a thickness of between 0.010 and 0.063 inches, although other dimensions are also possible. The connections to the platen 160 may pass from the atmospheric environment through the interior of the inner liner 310. As such, the inner liner 310 serves to confine these connections to a predetermined volume within the shaft 130. These connections may include power signals, cooling or heating fluids, and others.

An insulative layer 320 is disposed around the outer diameter of the inner liner 310. The insulative layer 320 may be made from glass or ceramic fibers. Alternatively, any other material having a thermal conductivity of less than about 0.050 W/m° K may be used. In some embodiments, the insulative layer 320 has a thickness of between 0.375 and 0.75 inches.

The shaft 130 also includes a temperature modification device 330, which is disposed between the insulative layer 320 and the outer shell 300 and may be disposed throughout the length and circumference of the shaft 130. In some embodiments, the temperature modification device 330 is adjacent to and in contact with the inner surface of the outer shell 300. In this way, the temperature modification device 330 is able to affect the temperature of the outer shell 300. However, because the insulative layer 320 is disposed between the temperature modification device 330 and the inner liner 310, the temperature effect on the inner liner 310 is sufficiently reduced such that thermal expansion of the inner liner 310 is not problematic. The temperature modification device 330 may be any device or structure that may be used to adjust the temperature of the outer shell 300. This includes resistive heaters, thermoelectric heaters, cooling channels, and others.

In the embodiment shown in FIG. 3, the temperature modification device 330 may be formed as a resistive heater formed adjacent to the inner surface of the outer shell 300. Power is supplied to the resistive heater by a power supply 340, which may be disposed in the atmospheric environment 1. By proper application of power, the outer shell 300 may be maintained at a temperature of between 20° C. and 100° C. For example, temperature sensors 350, which may be thermocouples or resistance temperature detectors (RTDs), may be mounted to the inner or outer surface of the outer shell 300. Information from the temperature sensors 350 may be used to control the power supplied by the power supply 340 to the resistive heater. In some embodiments, controller 180 may be used to receive the information from the temperature sensor 350 and control this power supply 340. In other embodiments, a separate controller may be utilized. In other embodiments, a temperature sensor may not be utilized. Rather, the controller may use open loop control to regulate the temperature of the outer shell 300.

Figure 4:
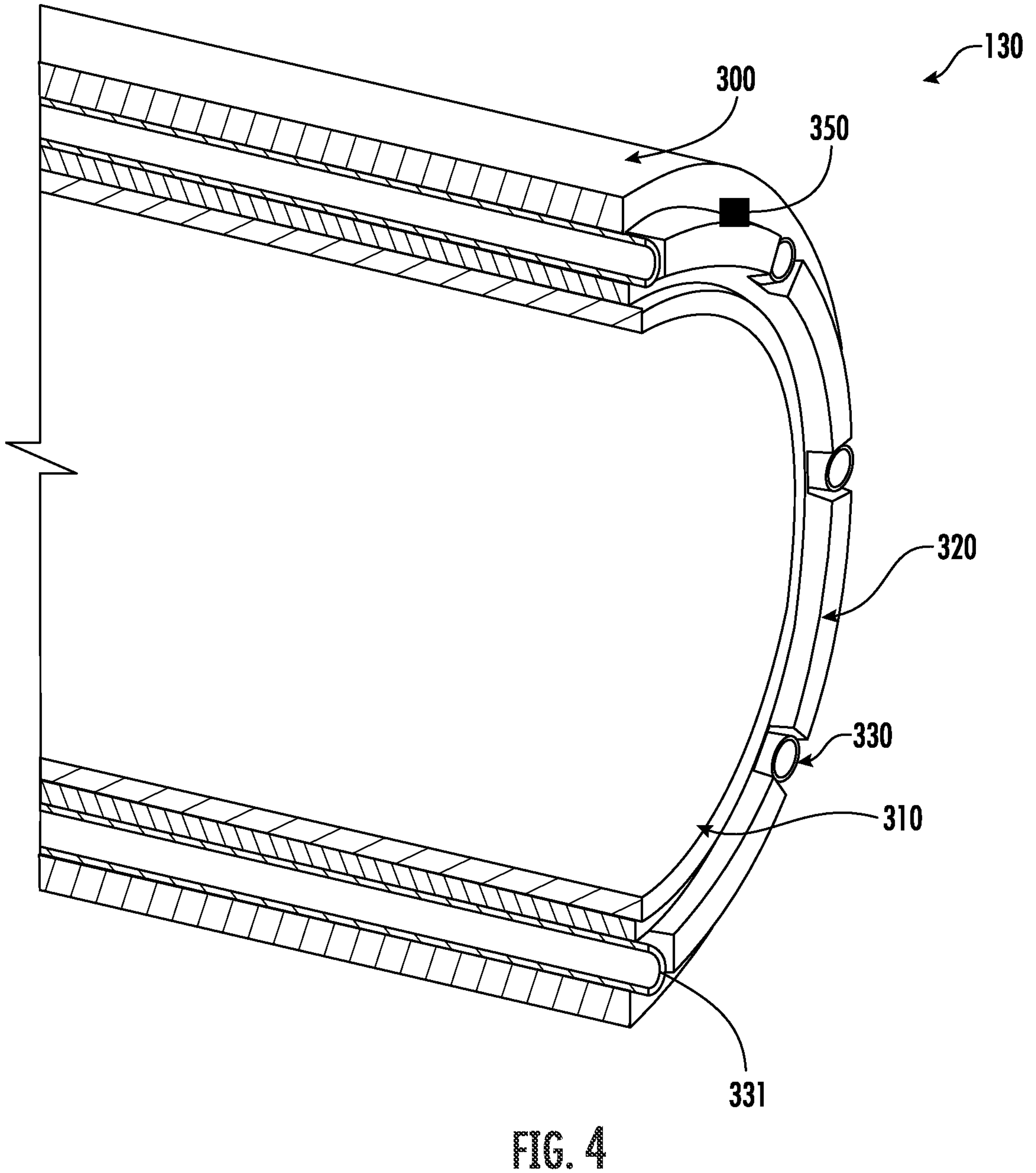
FIG. 4 shows the cross section of the shaft according to another embodiment.

FIG. 4 shows a different embodiment of the shaft 130, wherein the temperature modification device 330 comprises fluid tubes 331. The fluid tubes 331 may include one or more tubes that travel along the shaft 130. The fluid tubes 331 may be adjacent to the outer shell 300. In some embodiments, the insulative layer 320 is formed to create channels in which the fluid tubes 331 is disposed. While the channels reduce the thickness of the insulative layer 320 in certain regions, at least a portion of the insulative layer 320 is disposed between the fluid tubes 331 and the inner liner 310.

In some embodiments, the fluid tubes 331 may be used to carry a cooling fluid, such as water or a cooled gas. In this embodiment, the fluid tubes 331 may include at least one inlet and one outlet, which are in communication with a chiller (not shown). In this way, fluid that exits the fluid tubes 331 via the one or more outlets enters the chiller, where it is cooled. The fluid then exits the chiller and reenters the fluid tubes 331 via the one or more inlets. For example, a process may be performed at an elevated temperatures, such as greater than 500° C., which may cause the outer shell 300 to be heated and possibly expand. By allowing the passage of cooling fluid through the fluid tubes 331, the temperature of the outer shell 300 may be maintained within a desired temperature range.

In other embodiments, a heated fluid may be passed through the fluid tubes 331. The heated fluid may be heated nitrogen gas, water, fluorinert, Galden® or another suitable fluid. As described above, the fluid tubes 331 may include at least one inlet and one outlet, which are in communication with a heater (not shown). In this way, fluid that exits the fluid tubes 331 via the one or more outlets enters the heater. The heated fluid then exits the heater and reenters the fluid tubes 331 via the one or more inlets.

In some embodiments, a controller is used to control the flow rate and/or temperature of the fluid (either cooling fluid or heated fluid) through the fluid tubes 331. For example, controller 180 may perform this function. Alternatively, a different controller may be used. Additionally, a temperature sensor 350, similar to that described above, may be mounted to the inner surface or outer surface of the outer shell 300 to monitor the temperature of the outer shell 300. Information from the temperature sensor may be used by the controller to control the flow rate of the fluid and may also be used to control the operation of the heater or chiller, if desired.

The heater and/or chiller may be disposed in the atmospheric environment 1.

While FIGS. 3-4 show an inner liner 310, in other embodiments, the inner liner 310 may be omitted. In these embodiments, the connections to the platen 160 pass through the interior of the shaft 130. The insulative layer 320 may be disposed between the temperature modification device 330 and the connections to limit the temperature variations that these connections are exposed to.

The system and method described herein have many advantages. First, the amount of water that enters a process chamber via the shaft 130 may be greatly reduced. As noted above, in certain embodiments, the ion beam 127 contains fluorine ions, which react vigorously with water molecules to form ozone and hydrofluoric acid. The hydrofluoric acid may etch the shaft 130, the walls 101 of the process chamber 100, or another component within the process chamber 100. Thus, the possibility of this reaction is minimized by reducing the amount of water that enters the process chamber 100 via the shaft 130. Further, by heating the shaft, the deposition of film on the shaft 130 within the process chamber 100 during an etching process may be reduced as well. Additionally, conventional mechanisms to reduce contamination have significant drawbacks. Heating a traditional shaft using conventional methods to inhibit the condensation of water is problematic, as the heating of the shaft increases its diameter, creating issues when passing through the air bearing 140. Further, the amount of energy to heat the entirety of shaft 130 may be excessive. By having an outer shell made of a low CTE material, both of these issues are addressed. First, heating of the outer shell does not change its diameter, as its CTE is very low. Secondly, since only the outer shell is being heated, the volume of material to be heated is reduced, lowering the amount of energy needed to heat the shaft. This disclosed approach significantly reduces the amount of water that enters the process chamber, while retaining all of the existing components in the system.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing system, comprising:
a process chamber, maintained at near vacuum conditions; and
a shaft extending through a wall of the process chamber, wherein the shaft can be extended into and retracted from the process chamber;
wherein the shaft comprises:
an outer shell constructed of a low CTE material;
a temperature modification device disposed adjacent to an inner surface of the outer shell; and
an insulative layer disposed between the temperature modification device and an interior of the shaft.

2. The workpiece processing system of claim 1, further comprising an inner liner disposed within the outer shell, wherein the insulative layer is disposed between the temperature modification device and the inner liner.

3. The workpiece processing system of claim 2, wherein the inner liner comprises stainless steel, plastic or a wire mesh.

4. The workpiece processing system of claim 1, wherein the low CTE material comprises Invar or Super Invar 32-5.

5. The workpiece processing system of claim 1, wherein the temperature modification device comprises a resistive heater.

6. The workpiece processing system of claim 5, further comprising a power supply to supply power to the resistive heater and a controller to control the power supplied to the resistive heater.

7. The workpiece processing system of claim 6, further comprising a temperature sensor, wherein information from the temperature sensor is used by the controller to control the power supplied by the power supply to the resistive heater.

8. The workpiece processing system of claim 7, wherein the temperature sensor is mounted on an inner surface or outer surface of the outer shell.

9. The workpiece processing system of claim 1, wherein the temperature modification device comprises fluid tubes.

10. The workpiece processing system of claim 9, wherein the fluid tubes are used to heat the outer shell, and further comprising a heater in communication with the fluid tubes such that fluid passes through the heater into the fluid tubes and returns to the heater.

11. The workpiece processing system of claim 9, wherein the fluid tubes are used to cool the outer shell, and further comprising a chiller in communication with the fluid tubes such that fluid passes through the chiller into the fluid tubes and returns to the chiller.

12. The workpiece processing system of claim 9, further comprising a temperature sensor mounted on an inner surface or outer surface of the outer shell, wherein information from the temperature sensor is used to control a flow rate and/or temperature of a fluid passing through the fluid tubes.

13. A beam-line ion implantation system, comprising:
an ion source to generate an ion beam;
a mass analyzer;
a process chamber, maintained at near vacuum conditions;
one or more beam-line components to direct the ion beam toward a process chamber; and a shaft extending through a wall of the process chamber, wherein the shaft can be extended into and retracted from the process chamber;

wherein the shaft comprises:

an outer shell constructed of a low CTE material;

a temperature modification device disposed adjacent to an inner surface of the outer shell; and an insulative layer disposed between the temperature modification device and an interior of the shaft.

14. The beam-line ion implantation system of claim 13, further comprising an inner liner disposed within the outer shell, wherein the insulative layer is disposed between the temperature modification device and the inner liner, and wherein the inner liner comprises stainless steel, plastic or a wire mesh.

15. The beam-line ion implantation system of claim 13, wherein the low CTE material comprises Invar or Invar 32-5.

16. The beam-line ion implantation system of claim 13, wherein the temperature modification device comprises a resistive heater.

17. The beam-line ion implantation system of claim 16, further comprising a power supply to supply power to the resistive heater, a controller to control the power supplied to the resistive heater and a temperature sensor, wherein information from the temperature sensor is used by the controller to control the power supplied by the power supply to the resistive heater.

18. The beam-line ion implantation system of claim 13, wherein the temperature modification device comprises fluid tubes.

19. The beam-line ion implantation system of claim 18, wherein the fluid tubes are used to heat the outer shell, and further comprising a heater in communication with the fluid tubes such that fluid passes through the heater into the fluid tubes and returns to the heater.

20. The beam-line ion implantation system of claim 18, wherein the fluid tubes are used to cool the outer shell, and further comprising a chiller in communication with the fluid tubes such that fluid passes through the chiller into the fluid tubes and returns to the chiller.

* * * * *